(12) United States Patent
Djelassi-Tscheck et al.

(10) Patent No.: US 10,580,762 B1
(45) Date of Patent: Mar. 3, 2020

(54) INTEGRATED CIRCUIT (IC) CHIP ARRANGEMENT

(71) Applicant: Infineon Technologies AG, Neubiberg (DE)

(72) Inventors: Christian Djelassi-Tscheck, Villach (AT); Bernhard Auer, Millstatt (AT); Markus Ladurner, A-Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/170,761

(22) Filed: Oct. 25, 2018

(51) Int. Cl.
*H01L 23/52* (2006.01)
*H01L 25/16* (2006.01)
*H01L 23/495* (2006.01)
*H01L 23/00* (2006.01)
*H01L 25/00* (2006.01)

(52) U.S. Cl.
CPC ........ *H01L 25/16* (2013.01); *H01L 23/49575* (2013.01); *H01L 24/32* (2013.01); *H01L 24/40* (2013.01); *H01L 24/48* (2013.01); *H01L 24/73* (2013.01); *H01L 25/50* (2013.01); *H01L 2224/32145* (2013.01); *H01L 2224/40175* (2013.01); *H01L 2224/48145* (2013.01); *H01L 2224/48175* (2013.01); *H01L 2224/49111* (2013.01); *H01L 2224/49112* (2013.01); *H01L 2224/49113* (2013.01); *H01L 2224/73215* (2013.01); *H01L 2224/73265* (2013.01)

(58) Field of Classification Search
CPC ... H01L 23/49575; H01L 24/48; H01L 24/40; H01L 24/73; H01L 24/32; H01L 25/16; H01L 25/50
USPC ........................................................ 257/777
See application file for complete search history.

(56) References Cited

U.S. PATENT DOCUMENTS

| | | | |
|---|---|---|---|
| 7,800,208 B2 * | 9/2010 | Otremba | H01L 23/3107 257/678 |
| 9,048,338 B2 * | 6/2015 | Hosseini | H01L 24/83 |
| 9,214,415 B2 * | 12/2015 | Denison | H01L 24/34 |
| 9,385,070 B2 * | 7/2016 | Tsai | H01L 23/49524 |

* cited by examiner

*Primary Examiner* — Luan C Thai
(74) *Attorney, Agent, or Firm* — Harrity & Harrity, LLP

(57) ABSTRACT

Examples disclosed herein involve integrated circuit chip arrangements. An example integrated circuit (IC) package may include a first semiconductor chip that includes a first metal-oxide-semiconductor field-effect transistor (MOSFET) and a second semiconductor chip mounted within a housing of the IC package. The second semiconductor chip may include a second MOSFET and a control circuit configured with a first driver for the first MOSFET and a second driver for the second MOSFET. The first semiconductor chip may be mounted to the second semiconductor chip opposite a base of the IC package.

20 Claims, 8 Drawing Sheets

INTEGRATED CIRCUIT (IC) CHIP ARRANGEMENT

BACKGROUND

An integrated circuit (IC) may include one or more components of an electronic circuit. The one or more components may be included within a semiconductor chip (e.g., a silicon chip). In some cases, multiple semiconductor chips may be combined to form an electronic circuit within a single package housing.

SUMMARY

According to some implementations, an integrated circuit (IC) package may include a first semiconductor chip that includes a first metal-oxide-semiconductor field-effect transistor (MOSFET) and a second semiconductor chip mounted within a housing of the IC package. The second semiconductor chip may include a second MOSFET and a control circuit configured with a first driver for the first MOSFET and a second driver for the second MOSFET. The first semiconductor chip may be mounted to the second semiconductor chip opposite a base of the IC package.

According to some implementations, a system may include a first metal-oxide-semiconductor field-effect transistor (MOSFET); a second MOSFET, wherein a source of the first MOSFET is connected to a drain of the second MOSFET; and a control circuit to control a signal to the first MOSFET or the second MOSFET. The first MOSFET may be on a first semiconductor chip and the second MOSFET and the control circuit may be on a second semiconductor chip that is separate from the first semiconductor chip. The first semiconductor chip may be mounted on the second semiconductor chip within a housing of an IC package.

According to some implementations, a method may include mounting a first semiconductor chip to a conductive layer of a second semiconductor chip such that the first semiconductor chip and the second semiconductor chip are configured to fit within a housing of an integrated (IC) package, wherein the first semiconductor chip includes a first metal-oxide-semiconductor field effect transistor (MOSFET); and fixing the second semiconductor chip on a base of the IC package, wherein the base of the IC package corresponds to a lead frame-side of the IC package, wherein the conductive layer is opposite the base of the IC package, and wherein the second semiconductor chip includes: a second MOSFET, and a control circuit that includes a first driver for the first MOSFET and a second driver for the second MOSFET.

DETAILED DESCRIPTION

Figure 1A:
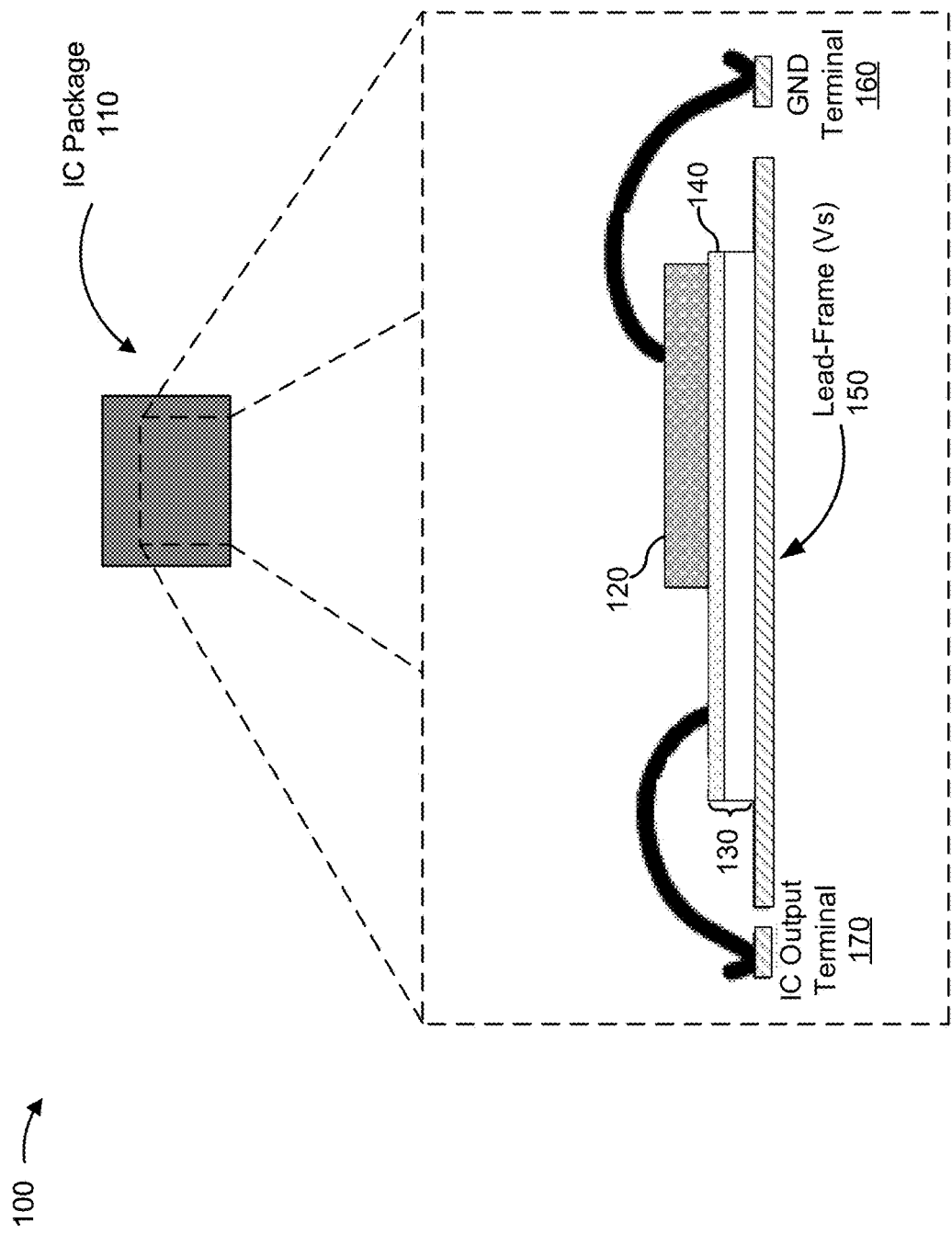
FIGS. 1A and 1B are diagrams associated with an example integrated circuit package, described herein.

The following detailed description of example implementations refers to the accompanying drawings. The same reference numbers in different drawings may identify the same or similar elements.

In some instances, multiple semiconductor chips are to be included within a same integrated circuit (IC) package. For example, IC packages with half-bridges, which include a pair of metal-oxide-semiconductor field-effect transistors (MOSFETs), may require multiple semiconductor chips to be included within the IC package (e.g., with each of the MOSFETs on separate semiconductor chips and/or a control circuit of the half-bridge on a separate chip). The half-bridges may be used to switch on motor drives. In some implementations, in a reverse block application, a driver (e.g., a gate driver) for a MOSFET may be included on a separate semiconductor chip from the MOSFET within the IC package.

Furthermore, to fit multiple semiconductor chips within a single package (and limit a size of a footprint of the IC package), one or more semiconductor chips may be stacked within an IC package. For example, semiconductor chips that each includes a MOSFET of a half-bridge may be fixed to a lead-frame side (e.g., a base or terminal side) of an IC package and connected to one another via a chip by chip packaging. In such a case, another semiconductor chip that includes a control circuit may be glued on top of one of the semiconductor chips (e.g., opposite the lead-frame side of the semiconductor chip) that includes the MOSFETs. In some instances, both MOSFETs may be fabricated on a same semiconductor chip with the control circuit semiconductor chip glued to the top of that semiconductor chip. While such semiconductor chips may enable multiple semiconductor chips to fit within a single IC package, the production of such packaging may be costly and require a relatively large package size.

In some instances, a chip on chip implementation that has a first MOSFET of a half-bridge with a source down is on a first semiconductor chip that is glued to a second semiconductor chip with a second MOSFET of the half-bridge with the drain down. In such cases, a current flow through the half-bridge may be blocked if a device of the IC package is off. However, producing such technology with a source down MOSFET of a semiconductor chip can be relatively expensive.

According to some implementations described herein, an IC package with a half-bridge is provided and/or built, using chip on chip technology. An example conductive layer of a semiconductor chip may be configured or formed as a part of the semiconductor chip and used as an output of the half-bridge circuit. Furthermore, a semiconductor chip used to build the half-bridge may be mounted to the conductive layer to enable simple production and/or assembly of the IC package. Accordingly, additional conductor material may not be required to mount one semiconductor chip to another semiconductor chip using the conductive layer. Furthermore, such a configuration may conserve IC package space and/or IC package size, enabling ease of assembly and reducing costs (e.g., materials costs, hardware costs, and/or assembly costs associated with manufacturing the IC package). Therefore, some implementations described herein may conserve materials and/or manufacturing resources by enabling more IC packages and/or more housings for the IC packages to be manufactured from a same amount of material as previous techniques.

Figure 1B:
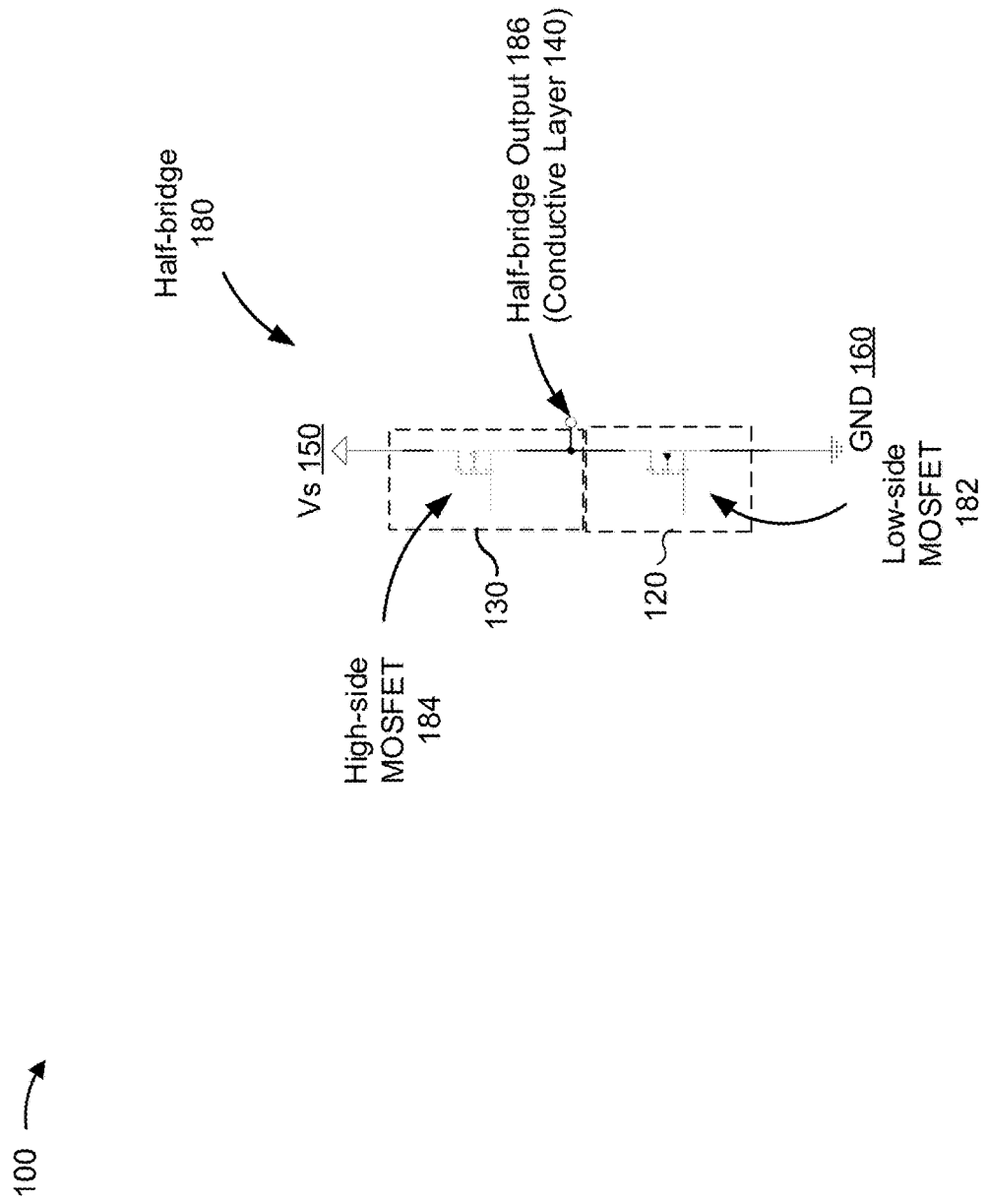

FIGS. 1A and 1B are diagrams associated with an example implementation described herein. In example implementation 100, an IC package 110 includes a first semiconductor chip 120 and a second semiconductor chip 130. The first semiconductor chip 120 and/or second semiconductor chip 130 may be formed from and/or include silicon or any other type of semiconductor. As shown in FIG.

1A, the first semiconductor chip 120 is mounted to a conductive layer 140 of the second semiconductor ship. The conductive layer 140 may be a layer of copper or any other type of conductor.

According to some implementations, the first semiconductor chip 120 may be mounted to the second semiconductor chip 130 using a die attach (DA) material and/or a DA process. For example, the first semiconductor chip 120 may be attached or mounted to the second semiconductor chip 130 (e.g., to the conductive layer of the second semiconductor chip 130) using one or more of soldering, sintering, adhering (e.g., using a conductive glue), and/or the like. According to some implementations, the first semiconductor chip 120 may include one or more components and/or one or more terminals of components on the base of the first semiconductor chip 120 (e.g., corresponding to a backside of an n-type MOSFET (NMOS)) that is mounted to the conductive layer 140. The first semiconductor chip 120 and the second semiconductor chip 130 may be mounted within a housing (e.g., a non-conductive housing) of the IC package 110. Furthermore, when viewed from above (or below), a perimeter of the first semiconductor chip 120 may be within a perimeter of the second semiconductor chip 130 such that the first semiconductor chip 120 does not extend over an edge of the second semiconductor chip 130.

As further shown in FIG. 1A, the conductive layer 140 is opposite a base of the second semiconductor chip 130. The base of the second semiconductor chip 130 may be mounted to a lead-frame 150 of the IC package 110. Accordingly, the conductive layer 140 of the second semiconductor chip may be configured to be opposite a lead-frame side of the IC package 110. The lead-frame 150 may provide conductivity and/or cooling for the IC package 110. As shown in FIG. 1A, the lead-frame 150 of the IC package 110 may provide a supply voltage (Vs) to the IC package 110. The supply voltage may provide power to a circuit formed from the first semiconductor chip 120 and the second semiconductor chip 130 of the IC package 110.

Furthermore, as shown in FIG. 1A, the IC package 110 may include a ground terminal 160 (GND) and an IC output terminal 170. The ground terminal 160 may be communicatively coupled and/or in contact with a ground of a circuit (e.g., a circuit of a printed circuit board (PCB)). The IC output terminal 170 may be an output of an IC (e.g., formed from components of the first semiconductor chip 120 and the second semiconductor chip 130) of the IC package 110 that may be communicatively coupled with one or more other components of a circuit (e.g., via a PCB). As shown, the conductive layer 140 of the second semiconductor chip 130 is connected to the IC output terminal 170 (e.g., via one or more bond wires, one or more copper clips, and/or the like), and the first semiconductor chip 120 is connected to the ground terminal 160 (e.g., via one or more bond wires, one or more copper clips, and/or the like).

As shown in FIG. 1B, the IC package 110 of example implementation 100 may include a half-bridge 180. The half-bridge includes a low-side MOSFET 182 and a high-side MOSFET 184. In example implementation 100, the low-side MOSFET 182 is on the first semiconductor chip 120 and the high-side MOSFET 184 is on the second semiconductor chip 130. In some implementations, the low-side MOSFET and the high-side MOSFET are n-type MOSFETs (NMOSs). In some implementations, the low-side MOSFET 182 is a NMOS and the high-side MOSFET 184 is a p-type (PMOS).

As shown in a circuit of the half-bridge 180 in FIG. 1B, a drain of the low-side MOSFET 182 is communicatively coupled with a source of the high-side MOSFET 184. Furthermore, a half-bridge output 186 from the half-bridge 180 may be provided from the communicatively coupled drain of the low-side MOSFET 182 and source of the high-side MOSFET 184. As shown, the half-bridge output 186 of the half-bridge 180 may be communicatively coupled with and/or correspond to the conductive layer 140 of the second semiconductor chip 130. Accordingly, because conductive layer 140 is communicatively coupled with the IC output terminal 170, the half-bridge output 186 may correspond to an output from the IC package 110 via the IC output terminal 170. As such, an output from IC package 110 may be the half-bridge output 186. Furthermore, the drain of the high-side MOSFET 184 may be communicatively coupled with the lead-frame 150, and thus a supply voltage (Vs) of the IC package 110. Additionally, or alternatively, the source of the low-side MOSFET 182 may be communicatively coupled with the ground terminal 160, and thus a ground of IC package 110. Accordingly, the half-bridge 180 may be formed and/or communicatively coupled with other components of a circuit (e.g., via a PCB) through terminals of the IC package 110.

In some implementations, as further described herein, a gate of the low-side MOSFET 182 and/or a gate of the high-side MOSFET 184 may be controlled by one or more drivers (e.g., gate drivers) of a control circuit of the IC package 110.

As indicated above, FIGS. 1A and 1B are provided merely as an example. Other examples are possible and may differ from what was described with regard to FIGS. 1A and 1B.

Figure 2:
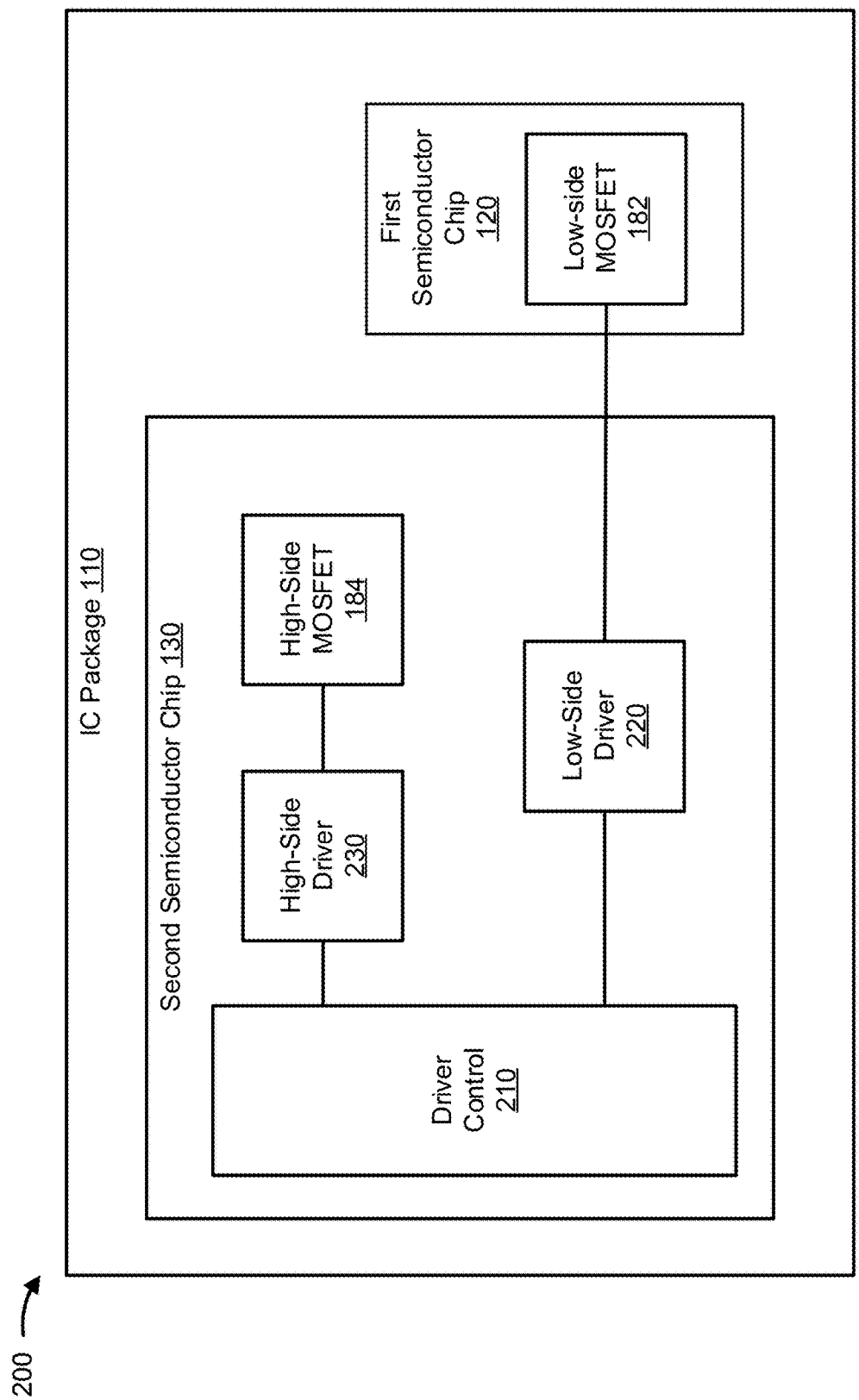
FIGS. 2 and 3 are block diagrams of example implementations of an integrated circuit package of FIG. 1A.

FIG. 2 is a block diagram of an example implementation 200 of the integrated circuit package 110 of FIG. 1A. As shown in FIG. 2, the IC package 110 includes the first semiconductor chip 120 and the second semiconductor chip 130. The first semiconductor chip 120 and the second semiconductor chip may be enclosed within a housing of the IC package 110 of FIG. 2. As described herein, the first semiconductor chip 120 may be mounted to the second semiconductor chip 130.

As further shown in FIG. 2, the first semiconductor chip 120 includes the low-side MOSFET 182. The second semiconductor chip 130 includes the high-side MOSFET 184 and a control circuit that includes a driver control 210, a low-side driver 220, and a high-side driver 230. In example implementation 200, the driver control 210 may control the low-side driver 220, which drives the low-side MOSFET 182 (e.g., via a gate of the low-side MOSFET 182), and the high-side driver 230, which drives the high-side MOSFET 184 (e.g., via a gate of the high-side MOSFET 184).

The example driver control 210 may include one or more components and/or modules to control the low-side driver 220 and/or the high-side driver 230. For example, the driver control 210 may include a supply voltage supervision module, an over voltage protection module, a voltage sensor, an internal power supply, an intelligent latch, one or more outputs, one or more inputs, and a driver logic (e.g., with fast pulse width modulation (PWM)), a load current sensor, an output voltage limiter, and/or the like. The low-side driver 220 may be implemented via a power amplifier and/or may include a low-side gate control (e.g., with fast PWM), a low-side over current protection module, an over voltage clamping module, a low-side temperature monitor, and/or the like. Additionally, or alternatively the high-side driver 230 may be implemented via a similar power amplifier and/or similarly may include a high-side gate control (e.g., with a charge pump), a high-side over current protection module, an over voltage clamping module, a high-side temperature monitor, and/or the like.

Accordingly, as shown in example implementation 200 of FIG. 2, the first semiconductor chip 120 may include the low-side MOSFET 182 and the second semiconductor chip 130 may include the high-side MOSFET 184 and a control circuit for the low-side MOSFET 182 and high-side MOSFET 184 (which form a half-bridge controlled by the control circuit). The control circuit, on the second semiconductor chip 130 may include both drivers (the low-side driver 220 and the high-side driver 230) for the low-side MOSFET 182 and the high-side MOSFET 184.

The number and arrangement of elements and/or components shown in FIG. 2 are provided as an example. In practice, there may be additional elements and/or components, fewer elements and/or components, different elements and/or components, or differently arranged elements and/or components than those shown in FIG. 2. Furthermore, two or more elements and/or components shown in FIG. 2 may be implemented within a circuit, or a single element or component shown in FIG. 2 may be implemented as multiple, distributed elements or components. Additionally, or alternatively, a set of circuits (e.g., one or more circuits) of IC package 110 may perform one or more functions described as being performed by another set of circuits of IC package 110.

Figure 3:
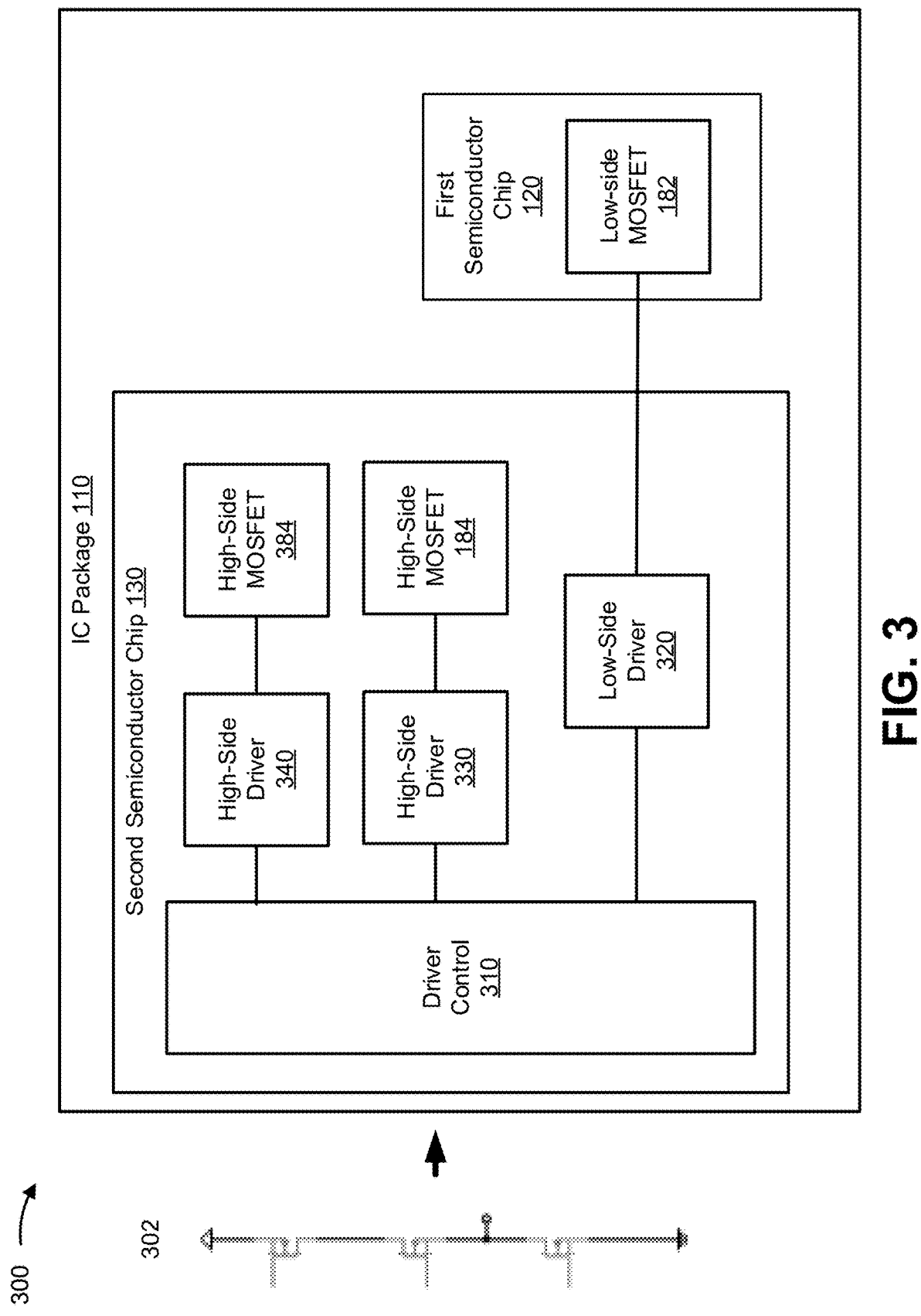

FIG. 3 is a block diagram of an example implementation 300 of the integrated circuit package 110 of FIG. 1A. Similar to example implementation 200, in example implementation 300, the IC package 110 includes the first semiconductor chip 120 and the second semiconductor chip 130 (e.g., enclosed within a housing of the IC package 110 FIG. 3). As described herein, the first semiconductor chip 120 may be mounted to the second semiconductor chip 130.

In example implementation 300, the IC package 110 may include a half bridge (or buck converter) that includes a reverse block, as shown by reference number 302. Accordingly, there may be one low-side MOSFET 182 and two high-side MOSFETs (shown as high-side MOSFET 184 and high-side MOSFET 384). Accordingly, the second semiconductor chip 130 may include a driver control 310 that is configured to control a low-side driver 320 and two high-side drivers 330, 340, which drive the high-side MOSFETs 184, 384, respectively. The driver control 310, low-side driver 320, and high-side drivers 330, 340 may be configured in a similar manner and/or include similar components or modules as driver control 210, low-side driver 220, and high-side driver 230, respectively, of example implementation 200.

Accordingly, as shown, a half-bridge with a reverse block (as shown by reference number 302) may be configured within the IC package 110 according to the example implementations described herein.

The number and arrangement of elements and/or components shown in FIG. 3 are provided as an example. In practice, there may be additional elements and/or components, fewer elements and/or components, different elements and/or components, or differently arranged elements and/or components than those shown in FIG. 3. Furthermore, two or more elements and/or components shown in FIG. 3 may be implemented within a circuit, or a single element or component shown in FIG. 3 may be implemented as multiple, distributed elements or components. Additionally, or alternatively, a set of circuits (e.g., one or more circuits) of IC package 110 may perform one or more functions described as being performed by another set of circuits of IC package 110.

Figure 4A:
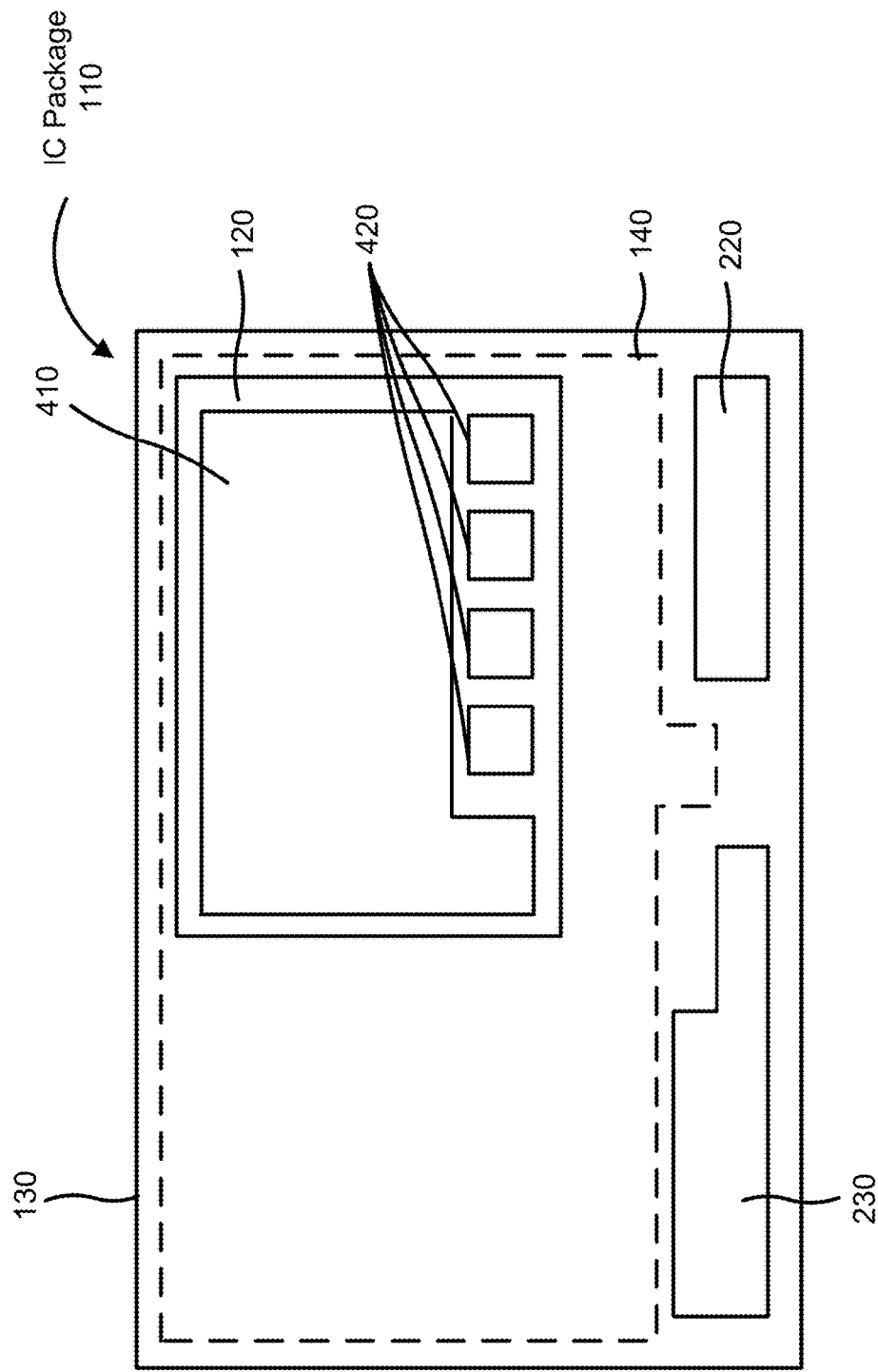
FIGS. 4A-4C are diagrams of example implementations as descried herein.
Figure 4B:
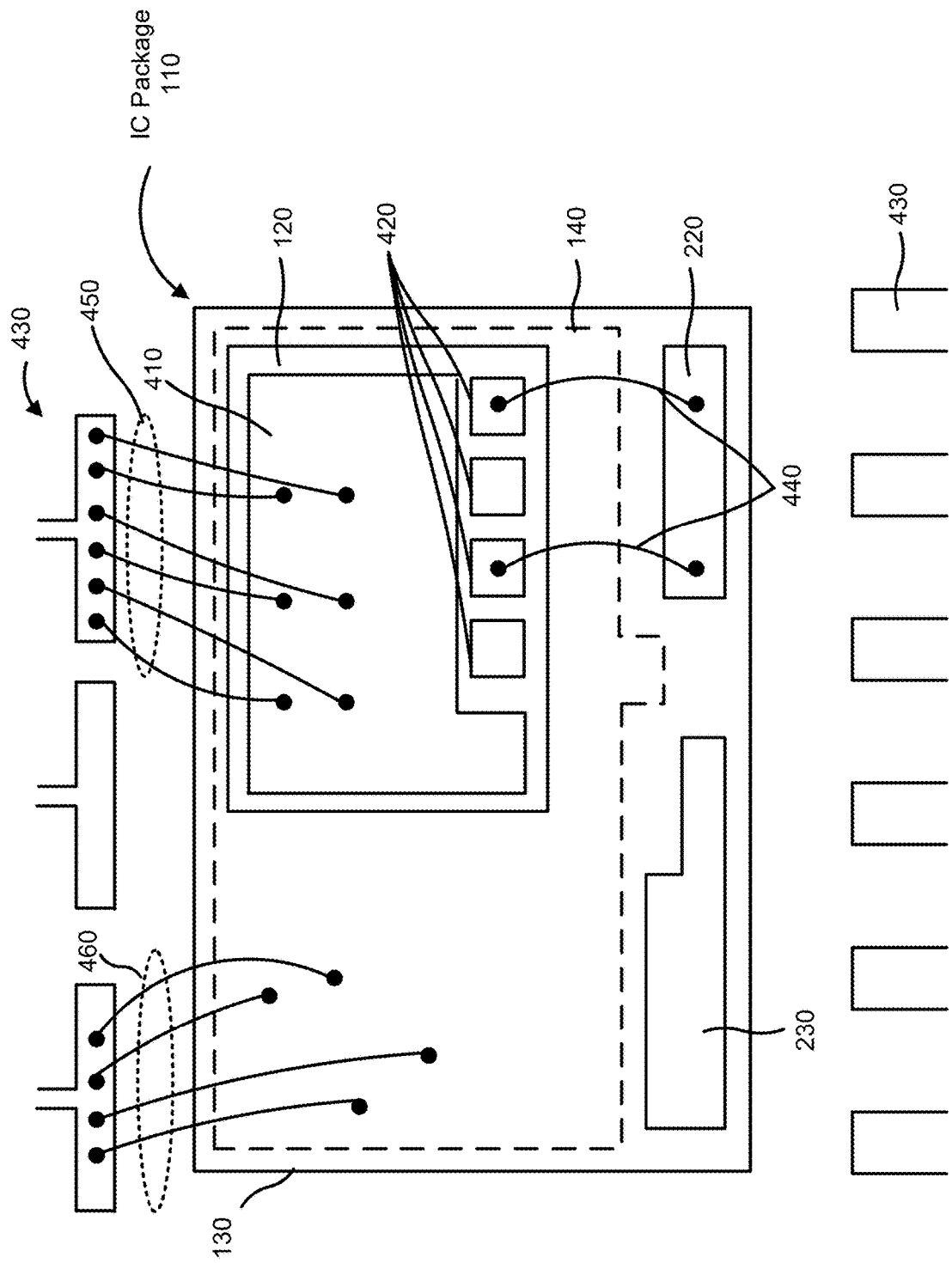
Figure 4C:
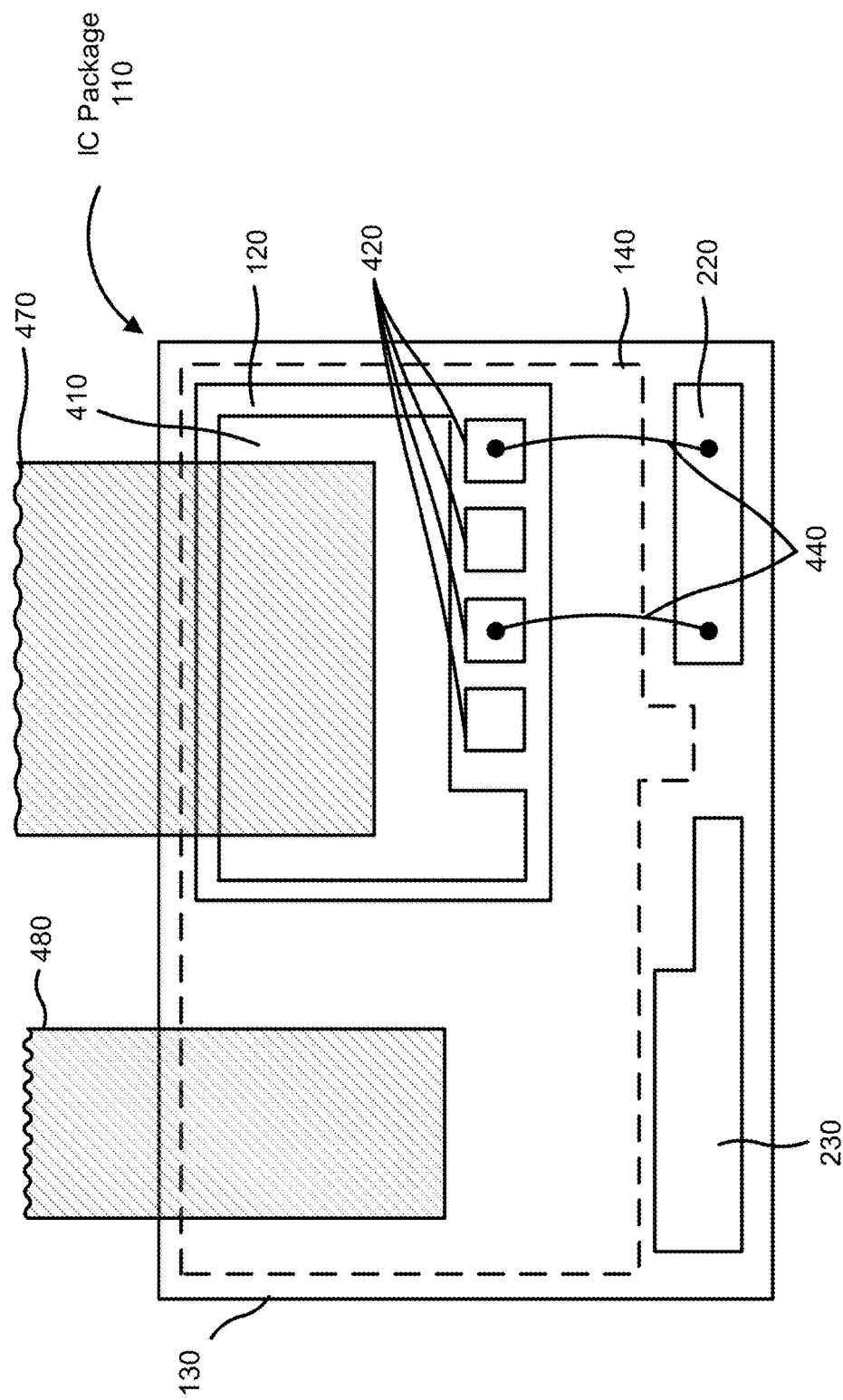

FIGS. 4A-4C are diagrams of implementations as described herein. In the example implementations of FIGS. 4A-4C, a top-view of the IC package 110 is shown. As shown in FIG. 4A, a top metal layer 410 and a gate 420 of a first MOSFET (e.g., low-side MOSFET 182) of first semiconductor chip 120 are shown. First semiconductor chip 120 is shown to be mounted to a conductive layer 140 (e.g., a top metal layer) of second semiconductor chip 130. In some implementations, a second MOSFET (e.g., high-side MOSFET 184) of second semiconductor chip 130 is substantially covered (relative to the top-view of FIGS. 4A-4C) by conductive layer 140. As shown, second semiconductor chip 130 includes low-side driver 220 and high-side driver 230.

As shown in FIG. 4B, IC chip 110 includes a lead frame 430 (which may include one or more terminals, as shown). A first set of bond wires 440 connect low-side driver 220 (e.g., an output of low-side driver 220) to gate 420 of the first MOSFET of first semiconductor chip 120, a second set of bond wires 450 connect a source of the first MOSFET of first semiconductor chip 120 to lead frame 430, and a third set of bond wires 460 connect conductive layer 140 to lead frame 430 to serve as an output of IC package 110 (i.e., the source of second semiconductor chip 130 and/or drain of first semiconductor chip 120).

As shown in FIG. 4C, one or more clips may be used as alternatives to one or more of the bond wires of FIG. 4B. For example, in FIG. 4C, a first clip 470 may be used to connect a source of first semiconductor chip 120 to lead frame 430 and a second clip 480 may be used to connect conductive layer 140 to lead frame 430. In some implementations, a third clip (not shown) may replace the first set of bond wires 440 to serve as a connection between gate 420 and an output of low-side driver 220.

The number and arrangement of elements and/or components shown in FIGS. 4A-4C are provided as an example. In practice, there may be additional elements and/or components, fewer elements and/or components, different elements and/or components, or differently arranged elements and/or components than those shown in FIGS. 4A-4C. Furthermore, two or more elements and/or components shown in FIGS. 4A-4C may be implemented within a circuit, or a single element or component shown in FIGS. 4A-4C may be implemented as multiple, distributed elements or components.

Figure 5:
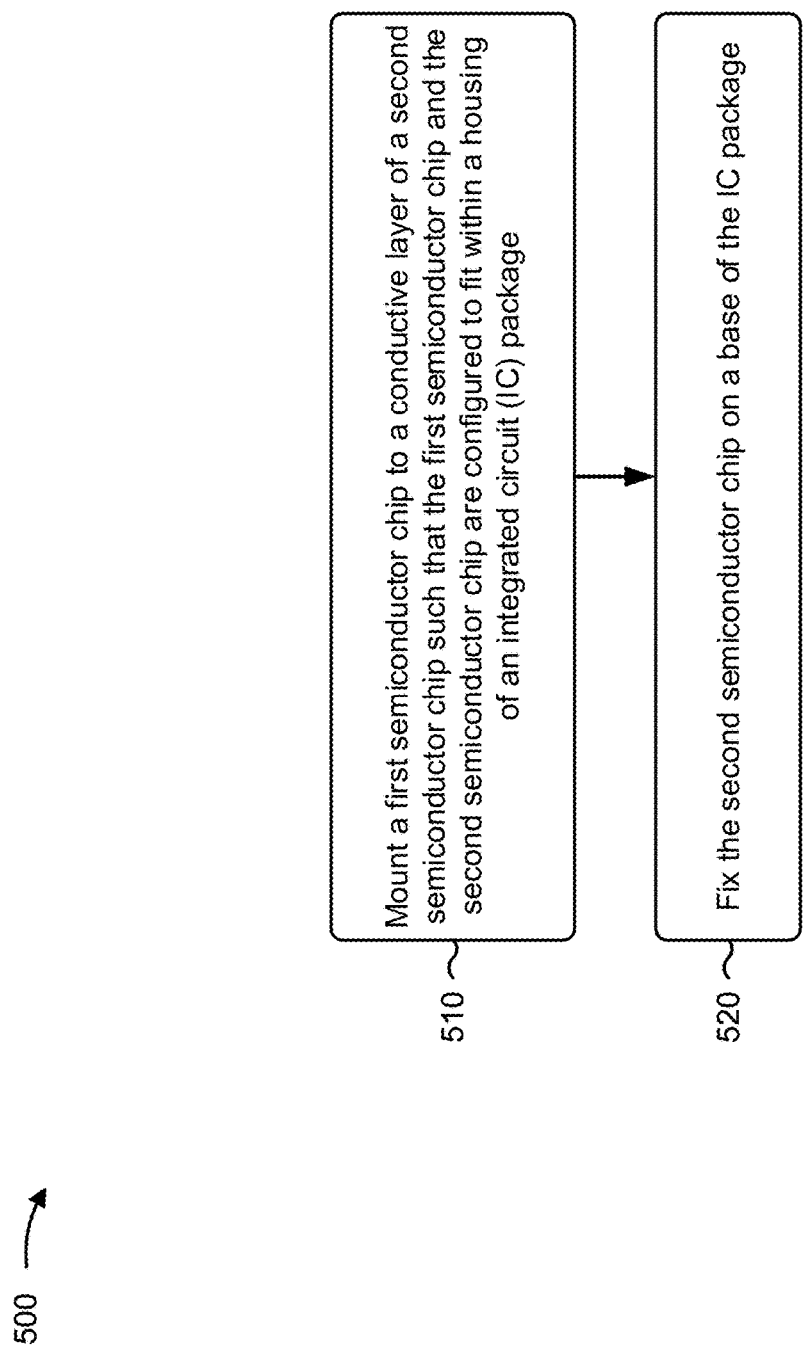
FIG. 5 is a flow chart of an example process associated with providing an integrated circuit chip arrangement as described herein.

FIG. 5 is a flow chart of an example process 500 associated with providing an integrated circuit chip arrangement as described herein. In some implementations, one or more process blocks of FIG. 5 may be performed by a machine associated with manufacturing an integrated circuit package that includes an integrated circuit chip arrangement, as described herein.

As further shown in FIG. 5, process 500 may include mounting a first semiconductor chip to a conductive layer of a second semiconductor chip such that the first semiconductor chip and the second semiconductor chip are configured to fit within a housing of an IC package (block 510). The first semiconductor chip may include a first MOSFET.

In some implementations, the first semiconductor chip is mounted to the conductive layer via at least one of soldering, sintering, or adhering the first semiconductor chip to the conductive layer after the second semiconductor chip is fixed to the base of the IC package. In some implementations, a perimeter of the second semiconductor chip is within a perimeter of the first semiconductor chip.

As shown in FIG. 5, process 500 may include fixing the second semiconductor chip on a base of the IC package (block 520). The base of the IC package may correspond to a lead frame-side of the IC package. The conductive layer may be opposite the lead-frame side of the IC package and the second semiconductor chip may further include a second MOSFET and a control circuit that includes a first driver for the first MOSFET and a second driver for the MOSFET. In some implementations, the first MOSFET may correspond to a high-side MOSFET of a half-bridge circuit and the second MOSFET may correspond to a low-side MOSFET of the half-bridge circuit.

In some implementations, the conductive layer may be configured and/or provided to be an output of a half-bridge circuit formed from the first MOSFET and the second MOSFET. In some implementations, the first MOSFET may be an n-type MOSFET (NMOS) and the second MOSFET may be an NMOS. In some implementations, the first MOSFET is a n-type MOSFET (NMOS) and the second MOSFET is an p-type MOSFET (PMOS). In some implementations, the first semiconductor chip includes only the first MOSFET and connections to the first MOSFET. In some implementations, a lead frame (corresponding to the lead-frame side) of the IC package may be connected to one or more terminals of the IC package. In some implementations, the second semiconductor chip may include a third MOSFET and the control circuit may include a third driver for the third MOSFET.

Although FIG. 5 shows example blocks of process 500, in some implementations, process 500 may include additional blocks, fewer blocks, different blocks, or differently arranged blocks than those depicted in FIG. 5. For example, in some implementations, the process of block 520 may be performed prior to the process of block 510. Additionally, or alternatively, two or more of the blocks of process 500 may be performed in parallel.

The foregoing disclosure provides illustration and description but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

EXAMPLES

1. An integrated circuit (IC) package, comprising:
    a first semiconductor chip that includes a first metal-oxide-semiconductor field-effect transistor (MOSFET); and
    a second semiconductor chip mounted within a housing of the IC package,
        wherein the second semiconductor chip includes:
            a second MOSFET; and
            a control circuit configured with a first driver for the first MOSFET and a second driver for the second MOSFET,
                wherein the first semiconductor chip is mounted to the second semiconductor chip opposite a base of the IC package.
2. The IC package of example 1, wherein the second semiconductor chip includes a conductive layer and the first semiconductor chip is mounted to the conductive layer.
3. The IC package of example 2, wherein the conductive layer corresponds to an output of a half-bridge circuit formed from the first MOSFET and the second MOSFET.
4. The IC package of any of examples 2-3, wherein the first semiconductor chip is mounted to the conductive layer via at least one of soldering, sintering, or gluing the first semiconductor chip to the conductive layer.
5. The IC package of any of examples 2-4, wherein the first MOSFET corresponds to a low-side MOSFET of a half-bridge circuit and the second MOSFET corresponds to a high-side MOSFET of the half-bridge circuit.
6. The IC package of any of examples 2-5, wherein the first MOSFET is an n-type MOSFET (NMOS) and the second MOSFET is an NMOS.
7. The IC package of any of examples 2-6, wherein the first MOSFET is a n-type MOSFET (NMOS) and the second MOSFET is an p-type MOSFET (PMOS).
8. The IC package of any of examples 2-7, wherein the first semiconductor chip includes only the first MOSFET and connections to the first MOSFET.
9. The IC package of any of examples 2-8, wherein the second semiconductor chip includes a third MOSFET and the control circuit includes a third driver for the third MOSFET.
10. The IC package of any of examples 2-9, wherein the base of the IC package corresponds to a lead frame-side of the IC package,
    wherein a lead frame of the IC package is connected to one or more terminals of the IC package.
11. A system comprising:
    a first metal-oxide-semiconductor field-effect transistor (MOSFET);
    a second MOSFET,
        wherein a source of the first MOSFET is connected to a drain of the second MOSFET; and
    a control circuit to control a signal to the first MOSFET or the second MOSFET,
        wherein the first MOSFET is on a first semiconductor chip and the second MOSFET and the control circuit are on a second semiconductor chip that is separate from the first semiconductor chip,
            wherein the first semiconductor chip is mounted on the second semiconductor chip within a housing of an IC package.
12. The system of example 11, wherein the first semiconductor chip includes a conductive layer and the second semiconductor chip is mounted to the conductive layer.

13. The system of any of examples 11-12, wherein the drain of the first MOSFET and the source of the second MOSFET are connected to the conductive layer.

14. The system of any of examples 11-13, wherein the conductive layer corresponds to an output of a half-bridge circuit formed from the first MOSFET and the second MOSFET.

15. The system of any of examples 11-14, wherein the first semiconductor chip is mounted to the conductive layer via at least one of soldering, sintering, or gluing the first semiconductor chip to the conductive layer.

16. The system of any of examples 11-15, the control circuit includes:
 a first driver to drive the first MOSFET; and
 a second driver to drive the second MOSFET.

17. The system of any of examples 11-16, further comprising:
 a third MOSFET,
  wherein a source of the third MOSFET is connected to a drain of the second MOSFET, the third MOSFET is on the second semiconductor chip, and the control circuit is configured to control a signal to the third MOSFET.

18. A method comprising:
 mounting a first semiconductor chip to a conductive layer of a second semiconductor chip such that the first semiconductor chip and the second semiconductor chip are configured to fit within a housing of an integrated (IC) package,
  wherein the first semiconductor chip includes a first metal-oxide-semiconductor field effect transistor (MOSFET); and
 fixing the second semiconductor chip on a base of the IC package,
  wherein the base of the IC package corresponds to a lead frame-side of the IC package,
  wherein the conductive layer is opposite the base of the IC package, and
  wherein the second semiconductor chip includes:
   a second MOSFET, and
   a control circuit that includes a first driver for the first MOSFET and a second driver for the second MOSFET.

19. The method of example 18, wherein the first semiconductor chip is mounted to the conductive layer via at least one of soldering, sintering, or adhering the first semiconductor chip to the conductive layer after the second semiconductor chip is fixed to the base of the IC package,
 wherein a perimeter of the first semiconductor chip is within a perimeter of the second semiconductor chip.

20. The method of any of examples 18-19, wherein the second MOSFET corresponds to a high-side MOSFET of a half-bridge circuit and the first MOSFET corresponds to a low-side MOSFET of the half-bridge circuit.

21. A method comprising:
 fixing a first semiconductor chip on a base of an integrated circuit (IC) package,
  wherein the base of the IC package corresponds to a lead frame-side of the IC package, and
  wherein the first semiconductor chip includes:
   a conductive layer opposite the base of the first semiconductor chip,
   a first metal-oxide-semiconductor field effect transistor (MOSFET), and
   control circuitry that includes a first driver for the first MOSFET;
 mounting a second semiconductor chip to the conductive layer of the first semiconductor chip such that the first semiconductor chip and the second semiconductor chip are configured to fit within a housing of the IC package,
  wherein the second semiconductor chip includes a second MOSFET and the first semiconductor chip further includes a second driver for the second MOSFET.

22. The method of example 21, wherein the second semiconductor chip is mounted to the conductive layer via at least one of soldering, sintering, or adhering the second semiconductor chip to the conductive layer,
 wherein a perimeter of the second semiconductor chip is within the perimeter of the first semiconductor chip.

23. The method of any of examples 21-22, wherein the first MOSFET corresponds to a high-side MOSFET of a half-bridge circuit and the second MOSFET corresponds to a low-side MOSFET of the half-bridge circuit.

What is claimed is:

1. An integrated circuit (IC) package, comprising:
 a first semiconductor chip that includes a first metal-oxide-semiconductor field-effect transistor (MOSFET); and
 a second semiconductor chip mounted within a housing of the IC package,
  wherein the second semiconductor chip includes:
   a second MOSFET; and
   a control circuit configured with a first driver for the first MOSFET and a second driver for the second MOSFET,
    wherein the first semiconductor chip is mounted to the second semiconductor chip opposite a base of the IC package.

2. The IC package of claim 1, wherein the second semiconductor chip includes a conductive layer and the first semiconductor chip is mounted to the conductive layer.

3. The IC package of claim 2, wherein the conductive layer corresponds to an output of a half-bridge circuit formed from the first MOSFET and the second MOSFET.

4. The IC package of claim 2, wherein the first semiconductor chip is mounted to the conductive layer via at least one of soldering, sintering, or gluing the first semiconductor chip to the conductive layer.

5. The IC package of claim 1, wherein the first MOSFET corresponds to a low-side MOSFET of a half-bridge circuit and the second MOSFET corresponds to a high-side MOSFET of the half-bridge circuit.

6. The IC package of claim 1, wherein the first MOSFET is an n-type MOSFET (NMOS) and the second MOSFET is an NMOS.

7. The IC package of claim 1, wherein the first MOSFET is a n-type MOSFET (NMOS) and the second MOSFET is an p-type MOSFET (PMOS).

8. The IC package of claim 1, wherein the first semiconductor chip includes only the first MOSFET and connections to the first MOSFET.

9. The IC package of claim 1, wherein the second semiconductor chip includes a third MOSFET and the control circuit includes a third driver for the third MOSFET.

10. The IC package of claim 1, wherein the base of the IC package corresponds to a lead frame-side of the IC package,
 wherein a lead frame of the IC package is connected to one or more terminals of the IC package.

11. A system comprising:
 a first metal-oxide-semiconductor field-effect transistor (MOSFET);
 a second MOSFET,
  wherein a source of the first MOSFET is connected to a drain of the second MOSFET; and a control circuit to control a signal to the first MOSFET or the second MOSFET, wherein the first MOSFET is on a first semiconductor chip and the second MOSFET and the control circuit are on a second semiconductor chip that is separate from the first semiconductor chip, wherein the first semiconductor chip is mounted on the second semiconductor chip within a housing of an IC package.

12. The system of claim 11, wherein the first semiconductor chip includes a conductive layer and the second semiconductor chip is mounted to the conductive layer.

13. The system of claim 12, wherein the drain of the first MOSFET and the source of the second MOSFET are connected to the conductive layer.

14. The system of claim 12, wherein the conductive layer corresponds to an output of a half-bridge circuit formed from the first MOSFET and the second MOSFET.

15. The system of claim 12, wherein the first semiconductor chip is mounted to the conductive layer via at least one of soldering, sintering, or gluing the first semiconductor chip to the conductive layer.

16. The system of claim 11, the control circuit includes:
a first driver to drive the first MOSFET; and
a second driver to drive the second MOSFET.

17. The system of claim 11, further comprising:
a third MOSFET,
wherein a source of the third MOSFET is connected to a drain of the second MOSFET, the third MOSFET is on the second semiconductor chip, and the control circuit is configured to control a signal to the third MOSFET.

18. A method comprising:
mounting a first semiconductor chip to a conductive layer of a second semiconductor chip such that the first semiconductor chip and the second semiconductor chip are configured to fit within a housing of an integrated (IC) package, wherein the first semiconductor chip includes a first metal-oxide-semiconductor field effect transistor (MOSFET); and fixing the second semiconductor chip on a base of the IC package, wherein the base of the IC package corresponds to a lead frame-side of the IC package, wherein the conductive layer is opposite the base of the IC package, and wherein the second semiconductor chip includes:
a second MOSFET, and
a control circuit that includes a first driver for the first MOSFET and a second driver for the second MOSFET.

19. The method of claim 18, wherein the first semiconductor chip is mounted to the conductive layer via at least one of soldering, sintering, or adhering the first semiconductor chip to the conductive layer after the second semiconductor chip is fixed to the base of the IC package, wherein a perimeter of the first semiconductor chip is within a perimeter of the second semiconductor chip.

20. The method of claim 18, wherein the second MOSFET corresponds to a high-side MOSFET of a half-bridge circuit and the first MOSFET corresponds to a low-side MOSFET of the half-bridge circuit.

* * * * *